United States Patent
Holmann et al.

(10) Patent No.: US 6,217,718 B1
(45) Date of Patent: Apr. 17, 2001

(54) METHOD AND APPARATUS FOR REDUCING PLASMA NONUNIFORMITY ACROSS THE SURFACE OF A SUBSTRATE IN APPARATUS FOR PRODUCING AN IONIZED METAL PLASMA

(75) Inventors: Ralf Holmann, San Jose; Zheng Xu, Foster City, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/251,690

(22) Filed: Feb. 17, 1999

(51) Int. Cl.$^7$ .................................................. C23C 14/34
(52) U.S. Cl. ...................... 204/192.12; 204/298.06; 204/298.08; 204/298.12; 118/723 I; 118/723 IR; 156/345; 427/569
(58) Field of Search .................. 204/192.12, 298.06, 204/298.08, 298.12; 118/723 I, 723 IR; 156/345; 427/569

(56) References Cited

U.S. PATENT DOCUMENTS

| 4,123,316 | 10/1978 | Tsuchimoto | 438/731 |
| 4,336,118 | 6/1982 | Patten et al. | 204/192.12 |

(List continued on next page.)

FOREIGN PATENT DOCUMENTS

| 0520519 | 6/1992 | (EP) . |
| 0607797 | 1/1994 | (EP) . |
| 2162365 | 1/1986 | (GB) . |
| 2231197 | 11/1990 | (GB) . |
| 59-190363 | 10/1984 | (JP) . |
| 61-190070 | 8/1986 | (JP) . |
| 6232055 | 8/1994 | (JP) . |
| 6283470 | 10/1994 | (JP) . |
| 7176398 | 7/1995 | (JP) . |
| 7176399 | 7/1995 | (JP) . |
| 8153712 | 6/1996 | (JP) . |
| 8288259 | 11/1996 | (JP) . |
| 8606923 | 11/1986 | (WO) . |

OTHER PUBLICATIONS

Hayden, D.B., et al., "Characterization of magnetron–sputtered partially ionized aluminum deposition," J. Vac. Sci. Technol. A 16(2), 624–627.

Schneider, Jochen M., et al., "Crystalline alumina deposited at low temperature by ionized magnetron sputtering," J. Vac. Sci. Technol. A15(3), pp. 1084–1088.

N. Jiwari et al., "Helicon wave plasma reactor employing single–loop antenna," J. of Vac. Sci. Technol., A 12(4), pp. 1322–1327, Jul./Aug. 1994.

(List continued on next page.)

Primary Examiner—Rodney McDonald
(74) Attorney, Agent, or Firm—Konrad Raynes & Victor

(57) ABSTRACT

An apparatus for processing a workpiece by delivering ions to the workpiece, which apparatus includes a processing chamber, a workpiece support having a workpiece support surface in the chamber, a sputtering target in the chamber and a coil for creating an inductively coupled plasma to sputter material from the target, ionize the sputtered material and direct the ionized, sputtered material at the workpiece. The coil is connected to receive an RF current for establishing in the coil an RF voltage having a peak-to-peak amplitude which varies between a minimum value at a first location along the circumference and a maximum value at a second location along the circumference, the first and second locations being substantially diametrically opposite one another, the RF voltage variation producing a corresponding variation in plasma density around the central axis. In order to counteract this plasma density variation, the coil is positioned so that the second location is at a greater distance than the first location from a plane containing the workpiece support surface. The coil may be formed to have a cross section which varies along the circumference from a maximum area at the first location to a minimum area at the second location.

53 Claims, 3 Drawing Sheets

U.S. PATENT DOCUMENTS

| | | | |
|---|---|---|---|
| 4,422,896 | 12/1983 | Class et al. | 216/67 |
| 4,626,312 | 12/1986 | Tracy | 156/345 |
| 4,661,228 | 4/1987 | Mintz | 204/192.25 |
| 4,842,703 | 6/1989 | Class et al. | 204/192.12 |
| 4,844,775 | 7/1989 | Keeble | 216/68 |
| 4,871,421 | 10/1989 | Ogle et al. | 438/710 |
| 4,918,031 | 4/1990 | Flamm et al. | 438/695 |
| 4,925,542 | 5/1990 | Kidd | 427/531 |
| 4,941,915 | 7/1990 | Matsuoka et al. | 204/298.12 |
| 4,948,458 | 8/1990 | Ogle | 438/729 |
| 4,990,229 | 2/1991 | Campbell et al. | 204/298.06 |
| 4,999,096 | 3/1991 | Nihei et al. | 204/192.3 |
| 5,102,496 | 4/1992 | Savas | 216/69 |
| 5,122,251 | 6/1992 | Campbell et al. | 204/298.06 |
| 5,135,634 | 8/1992 | Clarke | 204/298.06 |
| 5,146,137 | 9/1992 | Gesche et al. | 315/121.21 |
| 5,178,739 | 1/1993 | Barnes et al. | 204/192.12 |
| 5,198,725 | 3/1993 | Chen et al. | 315/111.41 |
| 5,231,334 | 7/1993 | Paranjpe | 315/111.21 |
| 5,234,560 | 8/1993 | Kadlec et al. | 204/192.12 |
| 5,241,245 | 8/1993 | Barnes et al. | 315/111.41 |
| 5,304,279 | 4/1994 | Coultas et al. | 156/345 |
| 5,346,578 | 9/1994 | Benzing et al. | 156/345 |
| 5,361,016 | 11/1994 | Ohkawa et al. | 315/111.41 |
| 5,397,962 | 3/1995 | Moslehi | 315/111.51 |
| 5,401,350 | 3/1995 | Patrick et al. | 156/345 |
| 5,404,079 | 4/1995 | Ohkuni et al. | 315/111.81 |
| 5,418,431 | 5/1995 | Williamson et al. | 315/111.51 |
| 5,429,070 | 7/1995 | Campbell et al. | 118/723 R |
| 5,429,995 | 7/1995 | Nishiyama et al. | 438/788 |
| 5,430,355 | 7/1995 | Paranjpe | 315/111.21 |
| 5,433,812 | 7/1995 | Cuomo et al. | 156/345 |
| 5,464,476 | 11/1995 | Gibb et al. | 118/723 MP |
| 5,503,676 | 4/1996 | Shufflebotham et al. | 118/723 MR |
| 5,525,159 | 6/1996 | Hama et al. | 118/723 I |
| 5,573,595 | 11/1996 | Dible | 118/723 MP |
| 5,639,357 | 6/1997 | Xu | 204/192.3 |
| 5,650,032 | 7/1997 | Keller et al. | 290/52 |
| 5,683,537 | 11/1997 | Ishii | 156/345 |
| 5,690,781 | 11/1997 | Yoshida et al. | 156/345 |
| 5,707,498 | 1/1998 | Ngan | 204/192.12 |
| 5,763,851 | 6/1998 | Forster et al. | 219/121.43 |
| 5,795,428 | 8/1998 | Ishii et al. | 156/345 |
| 5,810,931 | 9/1998 | Stevens et al. | 118/721 |
| 5,851,600 | 12/1998 | Horiike et al. | 427/535 |
| 5,874,704 | 2/1999 | Gates | 219/121.43 |

OTHER PUBLICATIONS

S.M. Rossnagel et al., "Magnetron Sputter Deposition with High Levels of Metal Ionization," *Appl. Phys. Lett.*, vol. 63, pp. 3285–3287, 1993.

J. Hopwood et al., "Mechanisms for Highly Ionized Magnetron Sputtering," *J. Appl. Phys.*, vol. 78, pp. 758–765, 1995.

S.M. Rossnagel, "Directional and Ionized Sputter Deposition for Microelectronics Applications," *Proc. of 3rd ISSP (Tokyo)*, pp. 253–260, 1995.

M. Yamashita, "Fundamental Characteristics of Built–in High Frequency Coil Type Sputtering Apparatus," *J. Vac. Sci. Technol.*, vol. A7, pp. 151–158, 1989.

M. Yamashita, "Sputter Type High Frequency Ion Source for Ion Beam Deposition Apparatus," *Jap. J. Appl. Phys.*, vol. 26, pp. 721–727, 1987.

U.S. patent application Ser. No. 08/856,335 filed May 14, 1997 (Atty. Dk. 1736/PVD/DV).

U.S. patent application Ser. No. 08/854,719 filed May 16, 1997 (Atty. Dk. 1752/PVD/DV).

U.S. patent application Ser. No. 08/854,944 filed May 16, 1997 (Atty. Dk. 1871/PVD/DV).

U.S. patent application Ser. No. 09/251,690 filed Feb. 17, 1999 (Atty. Dk. 1755/PVD/DV).

METHOD AND APPARATUS FOR REDUCING PLASMA NONUNIFORMITY ACROSS THE SURFACE OF A SUBSTRATE IN APPARATUS FOR PRODUCING AN IONIZED METAL PLASMA

BACKGROUND OF THE INVENTION

The present invention relates to methods and apparatus for sputtering ionized material from a solid target, or cathode, onto a workpiece or etching a workpiece with the aid of an inductively coupled plasma.

In the performance of a variety of semiconductor device fabrication procedures, ions are directed against a workpiece, such as a semiconductor wafer, or a group of semiconductor wafers. Such an operation involves creation of a plasma in a processing chamber, the plasma being created by establishing an RF field within the processing chamber, while the chamber contains a gas which is ionized by the field. In the case of an inductively coupled plasma generator, the field is produced by a coil.

In one process, a target body is also disposed in the chamber and is electrically biased to a potential that will attract ions to the target. Bombardment of the target with ions causes atoms of the target material to be ejected from the surface thereof. This action, known as "sputtering", is conventionally aided by associating the target with a magnet assembly, or magnetron, which produces a magnetic field that facilitates the creation of ions in the vicinity of the target.

Atoms ejected from the target may be ionized in the plasma and the substrate may be biased to a potential that will attract the target material ions. Typically, the target material is a metal, such as titanium or aluminum. Because the ions to be attracted to the substrate are usually positively charged, the substrate is, therefore, typically negatively biased.

The coil employed to produce the inductively coupled plasma acts as the primary winding of a transformer, with the plasma acting as a single turn secondary winding of the transformer.

Sputtering apparatus typically have a shield to protect the interior walls of the chamber from the sputtered material. As set forth in greater detail in copending application Ser. No. 08/559,345, filed Nov. 15, 1995, allowed entitled "Method and Apparatus for Generating a Plasma" and assigned to the assignee of the present application, the plasma generating coil of apparatus of this type can be installed within the shield of the processing chamber or mounted outside of the chamber shield. In either form of construction, the coil can have a single turn or a plurality of turns.

When the plasma generating coil is installed within the processing chamber shield, as set forth in codending application Ser. No. 08/680,335, filed Jul. 10, 1996, now abandoned entitled "Coils for Generating a Plasma and for Sputtering" and assigned to the assignee of the present application, the coil can be made of a material which permits the coil to provide an auxiliary sputtering source. In addition, as set forth in copending application Ser. No. 08/857,921, filed May 16, 1997 allowed entitled "Use of Variable Impedance to Control Coil Sputter Distribution" and assigned to the assignee of the present application, it has been found that both the rate at which material is sputtered from such a coil and the RF voltage distribution around the coil can vary as a function of coil location about the center axis of the processing chamber. These variances can contribute to nonuniformities in the processing of workpieces.

BRIEF SUMMARY OF THE INVENTION

It is an object of the present invention to reduce the effects of the above-described variations.

A more specific object of the invention is to position the plasma generating coil within the processing chamber in such a manner as to prevent or minimize variations, about the center axis of the processing chamber, in the quantity of ions delivered to the workpiece.

These and other objects and advantages are achieved in a semiconductor processing chamber which, in accordance with one aspect of the present invention, has a sputtering coil which is angled with respect to the central axis of the chamber or the plane of the upper surface of the workpiece. Such an arrangement is believed to compensate for nonuniform RF voltage distributions around the circumference of the coil. As a result, it is believed that variations in plasma density and coil sputtering rate as a function of coil circumference position may be reduced.

In an another aspect of the present invention, the interior area of the coil which can provides a primary sputtering surface of the coil may be varied in size as a function of coil circumference location. As a consequence, it is believed that the quantity of material sputtered from the coil onto the workpiece may be made more uniform with respect to angular location of the coil.

DETAILED DESCRIPTION OF THE INVENTION

Figure 1:
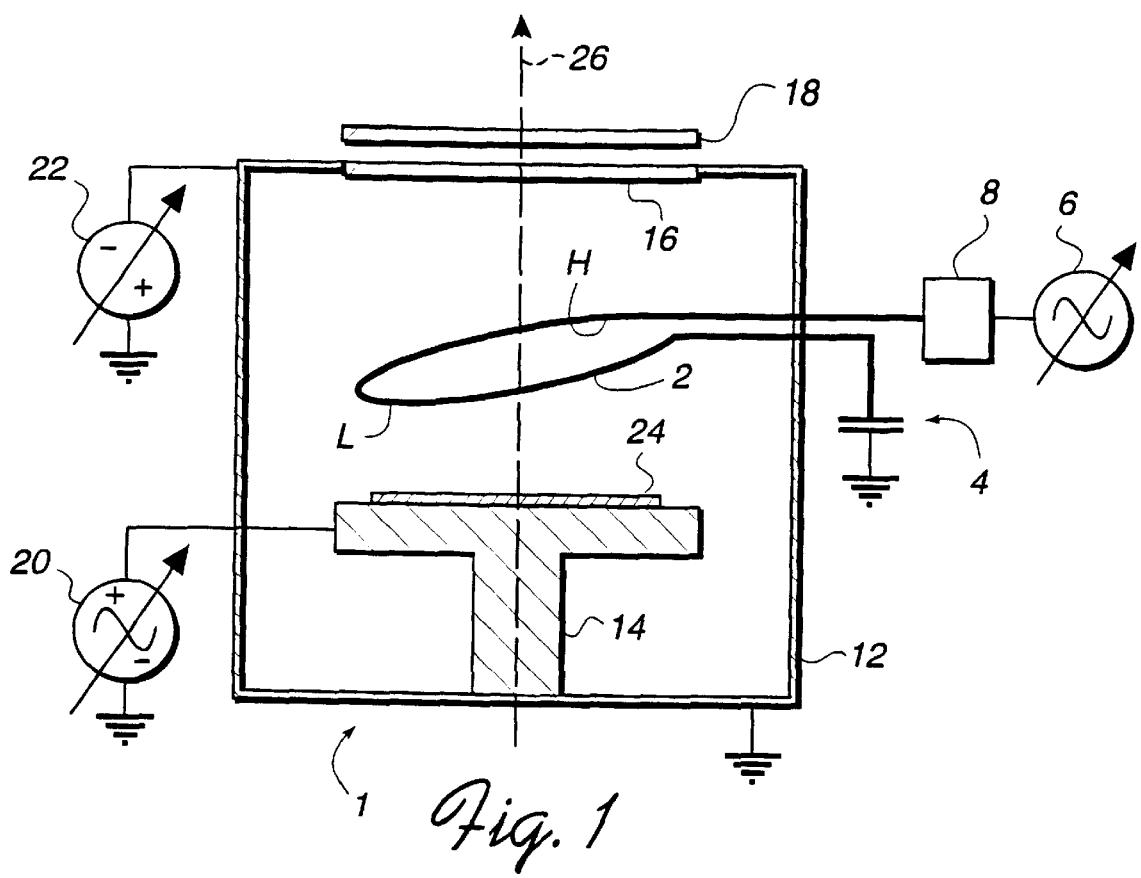
FIG. 1 is a simplified, elevational cross-sectional view of a processing chamber provided with a plasma generating coil according to a first embodiment of the invention.

FIG. 1 is a schematic view of a chamber 1 having an RF coil 2 positioned in the chamber 1 in accordance with the present invention. As described in greater detail below, and in accordance with one aspect of the present invention, the coil 2 is placed askew in the chamber 1 in a manner which can compensate for nonuniformities in the sputtering pattern and plasma generation patterns of previous coils. The coil 2 is installed in the chamber 1 to create an RF field. This field maintains a plasma in the processing chamber by being inductively coupled to the plasma. As set forth in the above-mentioned applications, one end of coil 2 is connected to ground via a capacitor 4 which is provided to block dc current flow. The other end of coil 2 is connected to an RF power generator 6 via a matching network 8.

Matching network 8 is selected so that the series arrangement of matching network 8, the inductance of coil 2 and the capacitance of capacitor 4 provide an impedance which is equal to the output impedance of generator 6. Typical commercially available RF power generators have an output impedance of the order of 50 ohms.

When an RF current is delivered to coil 2, an RF voltage is created in the coil. As set forth in copending application Ser. No. 08/857,921, filed May 16, 1997 entitled "Use of Variable Impedance to Control Coil Sputter Distribution", it has been found that the peak-to-peak value of this RF voltage varies progressively around the circumference of coil 2, or angularly around the coil axis, and may typically exhibit one cycle or a portion of a cycle of peak-to-peak voltage variation around the circumference of the coil. To cite one arbitrarily selected example, the RF voltage may have a maximum peak-to-peak value at point H (see top plan view of coil 2 in FIG. 2) and a minimum peak-to-peak value at point L. It should be understood, however, that depending on the specific configuration and dimensions of coil 2 and the impedance values of capacitor 4 and matching network 8, points A and B can have different locations along the circumference of coil 2.

It is believed that one result of this voltage variation is a corresponding plasma density variation about the axis of coil 2. Specifically, the plasma density along a line passing through point H and parallel to the axis of coil 2 may have a maximum value, while the plasma density along a similar line passing through point L may have a minimum value. This circumferential variation in plasma density can have a number of effects on a workpiece which is being processed. The nature of the effect which might be produced depends on the nature of the gas utilized to create the plasma, the composition of the target, and possibly also the composition of the workpiece.

For example, it is believed that the plasma density can influence the ionization rate and hence the density with which metal ions are deposited on the substrate. The higher the plasma density, the higher the density of deposited ions may be. Thus, the resulting deposited layer may have a greater thickness in the region of high plasma density and a smaller thickness in the region of lower plasma density.

In addition, if coil 2 is employed as an auxiliary sputtering source, the angular variation and RF potential along the coil in plasma density may produce a corresponding angular variation in the rate at which atoms are sputtered from the coil. Hence, more material may be sputtered from the coil onto the substrate in a region of higher plasma density (and RF coil potential) than in a region of lower plasma density.

Thus, in connection with all of the effects described above, the plasma density and RF voltage at each location around the coil axis may influence the rate of deposition of material at a corresponding angular location of the workpiece surface.

Furthermore, when a film of a metal, such as titanium, is being deposited by sputtering that metal from the target, the plasma may have the effect of sputtering or etching material from the workpiece simultaneously with the deposition of the titanium film. Since the intensity of this sputtering may be proportional to the plasma density, removal of material from the substrate may also vary about the axis of coil 2.

FIG. 1 is a simplified, elevational, cross-sectional view of an exemplary embodiment of apparatus according to the invention. To facilitate illustration of the embodiment, conventional components of such apparatus, including a system for delivering a plasma generating gas and support structures, are not illustrated. It will be understood that all components which are not illustrated may be conventional in the art and may be connected to the illustrated components in ways which are conventional in the art.

The illustrated apparatus includes a closed processing vessel 12 which contains a workpiece support 14, the coil 2 and a sputtering target 16. Above sputtering target 16 there is disposed, normally outside of vessel 12, a magnet assembly, such as a magnetron 18, which produces a magnetic field that promotes a desired pattern of sputtering of material from target 16. Workpiece support 14 and target 16 are connected to appropriate AC (or RF) and DC voltage sources 20 and 22, respectively, which effectuate a suitable bias to workpiece support 14 and target 16, respectively, the bias potentials typically being negative.

Workpiece support 14 provides, at its top, a horizontal workpiece support surface for supporting a workpiece 24, which is typically constituted by one or a plurality of semiconductor wafers. Target 16 may be of a metal, such as titanium, which is to be sputtered in order to form a layer of that metal on the upper surface of workpiece 24.

Figure 2:
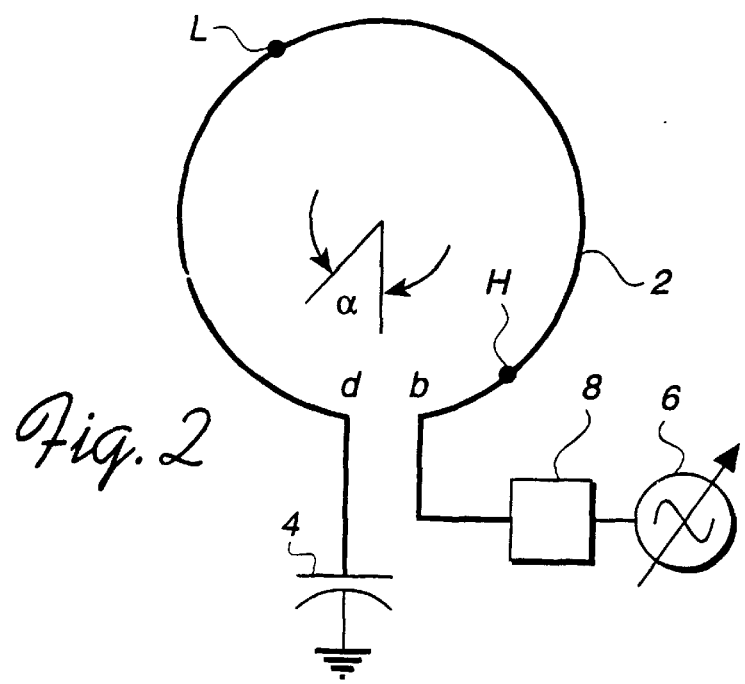
FIG. 2 is a simplified, schematic plan view of the single turn coil of FIG. 1.

Coil 2 may be interposed between target 16 and workpiece 24 and is connected, in the manner also illustrated in FIG. 1, to supply an RF current to coil 2. In FIG. 2, high peak to peak voltage point H and low peak to peak voltage point L have the same locations as shown in FIG. 1.

Figure 3:
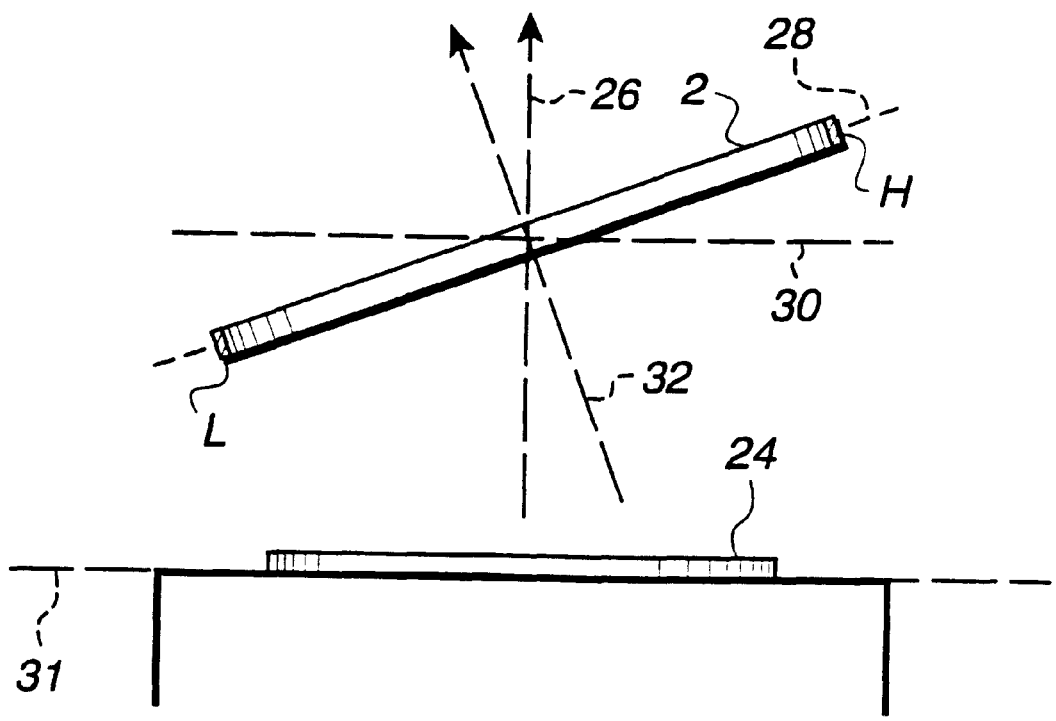
FIG. 3 is a side cross-sectional view of the coil of FIG. 1.

The interior of the chamber 1 has a central axis 26 which defines an axis of symmetry for many of the components inside the chamber including the target 16, the chamber shield (not shown) and the workpiece 24 itself. According to one aspect of the present invention, coil 2 is tilted so as to lie in a plane 28 (FIG. 3) which is inclined with respect to a horizontal plane 30 which plane 30 is generally parallel to the upper surface of the workpiece 24. In the illustrated embodiment, plane 30 is horizontal, i.e., generally perpendicular to the direction of gravity. The inclination of this coil plane 28 is such that point L of the coil lower edge is the point on coil 2 which is closest to the plane 31 of the workpiece support surface, on which workpiece 24 rests, and point H is the point on the coil lower edge which is most distant from the plane 31 containing the workpiece support surface. Since the RF voltage on coil 2 has its maximum peak-to-peak value at point H and its minimum peak-to-peak value at L, it is believed that the tilted orientation of coil 2 will reduce the variation in flux density across the surface of workpiece 24. Thus, proper selection of the angle of inclination of the plane containing coil 2 may reduce or eliminate non-uniform thickness deposition caused by plasma density variation which results from the peak-to-peak voltage variation. The optimum inclination will depend on a variety of factors including RF current magnitude, coil geometry, dc bias voltage magnitudes and the spacing between target 16, coil 2 and workpiece 24. However, based on knowledge of the principles underlying the invention, optimum inclination for a given apparatus and a given set of operating conditions can be readily determined by operating a given system with different coil inclinations. It is anticipated that in many applications, the angle of inclination may range from 1 to 45 degrees, for example. Also, the coil edge low point L may be from 1 to 50% closer to the plane of the workpiece support surface as compared to the coil lower edge high point H.

The problem addressed by the present invention is most apparent in the case of single turn coils. However, the invention can also be applied to multi-turn coils whenever it is found that a variation in peak-to-peak RF voltage occurs around the circumference of the multi-turn coil. In the case of a multi-turn coil located within plasma vessel 12, this coil can be in the form of a cylindrical helix or in the form of a spiral which may be planar or non-planar.

In the embodiment illustrated in FIG. 1, coil 2 is located within the processing chamber. Typically, coil 2 will have a diameter such that the coil 2 surrounds a cylindrical region containing workpiece 24.

Coils such as the single turn coil 2 of the illustrated embodiment, as well as multi-turn helix coils typically define a central axis at the center of an imaginary cylinder on which the coil turn or turns coincide. Planar and non planar spiral coils similarly typically define a central axis on which is located the origin or origins of the radii of the turns of the coil. In accordance with one aspect of the invention, the coil may be tilted such that the central axis of the coil as represented by the central axis 32 of the coil 2 may intersect the chamber central axis 26 at an angle. Here too, the proper selection of the angle of inclination of the coil axis may reduce plasma density or coil sputtering variations which result from the peak-to-peak voltage variation.

In the illustrated embodiment, the central axis of the workpiece is perpendicular to the workpiece support surface plane 31 and coincides with the chamber central axis 26. In some applications, the workpiece may be offset with respect to the chamber central axis. In such applications, the coil may be tilted such that the coil central axis 32 may intercept a workpiece axis which is perpendicular to the support surface plane 31 but not coincident with chamber central axis 26.

Although the illustrated embodiment has been described in connection with a sputtering coil having an central axis tilted so that the point of maximum voltage on the coil is farthest from the workpiece, it is anticipated that other tilt orientations may be useful, depending upon the application. For example, a coil location have an intermediate voltage may be positioned furthest from the workpiece. In another alternative, it may be advantageous to position the coil location having the maximum voltage farthest from the target so as to enhance uniformity of target sputtering. Such an orientation may be particularly useful in those applications in which the coil is not a sputter source for the workpiece.

Figure 4:
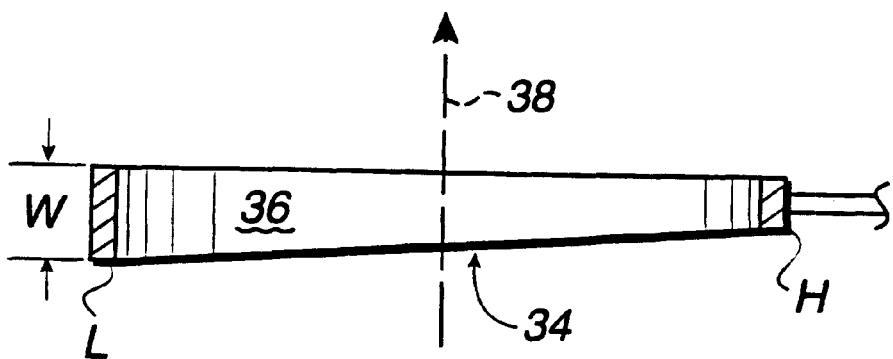
FIG. 4 is a cross-sectional view of a second embodiment of a plasma generating coil according to the invention.

According to another embodiment of the present invention, the plasma generating coil may have the form of the coil 34 shown in FIG. 4. FIG. 4 shows only one-half of the circumference of coil 34 and the other half, which is above the plane of the drawing, will have a form which is in mirror symmetry with the half that is illustrated, with respect to the plane of FIG. 4. This coil is made of a flat strip of a material which is to be sputtered onto the workpiece surface and the interior face 36 has a progressively varying width W. Width W has a minimum value at point H and a maximum value at point L and varies progressively between those values in both directions between points H and L.

At the narrowest point H, the RF voltage has its maximum peak-to-peak value, while at point L, the RF voltage has its minimum peak-to-peak value. Since the peak-to-peak value of the RF voltage varies progressively around the circumference of coil 34, and since the rate at which atoms are sputtered from coil 34 is dependent on both the plasma density adjacent the coil and size of the coil sputtering surface, it is believed that the provision of a minimum sputtering surface at the location of maximum RF peak-to-peak voltage may offset, at least partially, the influence of the RF peak-to-peak voltage value on the sputtering rate. Thus, the sputtering rate uniformity around the circumference of coil 32 may be improved by proper selection of the magnitude of the variation of the width of coil 34 around its circumference. The optimum width variation will depend on a number of factors, as described earlier herein, and for a given coil diameter and chamber configuration can readily be determined empirically by evaluating a plurality of coils with differing thick and thin areas to determine an optimum coil design. It is anticipated that in many applications, the coil maximum width may exceed the coil minimum width by 1 to 50%.

In addition, if it is found that the RF peak-to-peak voltage varies in some nonlinear manner around the circumference of coil 32, then coil 32 can be formed so that its width has a nonlinear variation around its circumference, the form of the variation being selected to correspond to that of the RF peak-to-peak voltage, the smallest area corresponding to the highest voltage. In this manner, the area of the interior face will vary, depending upon the coil location to compensate for voltage distribution variation. It is anticipated that in many applications, the coil widths at locations in at least 25% of the coil circumference will differ from the coil widths at locations in at least 25% of the coil circumference elsewhere on the coil circumference.

Coil 34 illustrated in FIG. 4 has a rectangular cross section. It will, of course, be appreciated, that coil 34 could be formed to have other cross sections.

In addition, coil 34 will preferably be mounted in vessel 12 of FIG. 1 so that the lower edge of coil 34 is inclined, as illustrated in FIG. 4. Then, the high point H of the lower edge of coil 32 will be at a greater distance than the lower point L of the coil lower edge from the plane containing the wafer support surface. Thus, compensation for plasma density variations around the circumference of coil 34 may also be achieved. It is anticipated that in many applications, an inclined coil edge may be from 1 to 50% closer to the workpiece support surface at the edge low point as compared to the coil edge high point.

In the embodiment of FIG. 4, the interior face 36 of the coil 34 defines a central axis 38 which is collinear with the central axis 26 (FIG. 1) of the chamber 1. It is anticipated that other embodiments may utilize a combination of tilting the coil axis and varying the width of the coil to offset variations in RF voltage distributions.

Figure 5:
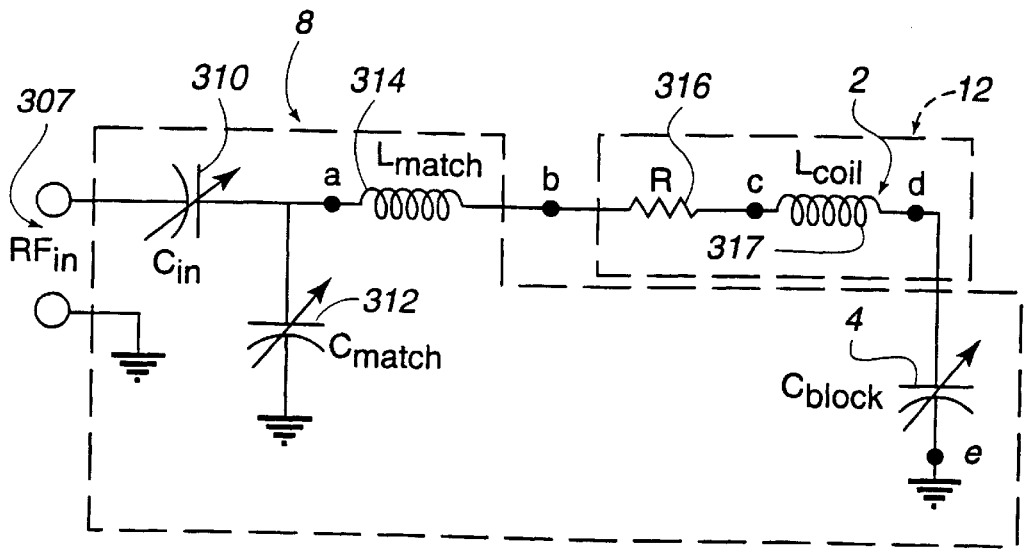
FIG. 5 is a schematic diagram illustrating an impedance-matching network and the plasma generating coil of FIG. 1.

FIG. 5 is a schematic diagram illustrating one example of an impedance-matching network 8 having an input capacitor 310 with a variable capacitance $C_{in}$, a parallel match capacitor 312 with a variable capacitance $C_{match}$ and a series match inductor 314 with an inductance $L_{match}$ coupled through the walls of the vacuum chamber 12 (FIG. 1) to one end of the coil 2. The blocking capacitor 4 is coupled through the walls of the vacuum chamber 12 to the other end of the coil 2. The coil 2 has an associated inductance $L_{coil}$ and a resistance R as shown by an equivalent resistor 316 and inductor 317. The input of the impedance-matching network 8 is coupled to the RF generator 6 (FIG. 1) through RF input 307.

One function of the network 8 is to match the impedance of the coil 2 combined with that of the network 8 to the impedance of the RF generator 6 to minimize the reflection of RF energy back to the generator to maximize the coupling of RF energy from the coil 2 to the plasma in the chamber. Accordingly, for a particular coil impedance $L_{coil}$ of the coil 2, the values of the input capacitor 310, match capacitor 312, match inductor 314, and blocking capacitor 4, may be chosen to provide a close match to the RF generator impedance which may be 50 ohms, for example. The impedances of the input capacitor $C_{in}$ and match capacitor $C_{in}$ may be finely tuned both prior to deposition and also during deposition to achieve and maintain a more precise match by adjusting the variable capacitances of the input capacitor 310 and match capacitor 312.

The value $C_{block}$ of the blocking capacitor 4, like that of blocking capacitors of prior impedance matching circuits, may also chosen so as to provide a large impedance to the RF energy being applied to the coil 2, so that the coil 2 develops a substantial DC bias. In addition, the distribution of RF voltages around the coil 2 is also a function of the impedance value $C_{block}$ of the blocking capacitor. Thus, the expected positions of the maximum and minimum peak-to-peak voltage points H and L, respectively, described above may be calculated for a given set of parameters as follows. The coil may be then be positioned accordingly to compensate as described above. Conversely, the impedance value $C_{block}$ of the blocking capacitor or other parameters may be set to ensure optimal positioning of the maximum and minimum peak-to-peak voltage points for a given coil configuration and positioning. This may be understood from the following.

The effective potential difference $V_{eff}$ between any two points of the alternating current (AC) series circuit from point a to point e in FIG. 5 equals the product of the effective current $I_{eff}$ and impedance Z of the AC circuit between the respective points. The effective potential difference $V_{ab}$ between points a and b across series inductor 314 with an inductance $L_{match}$ is given by $$V_{ab}=I_{eff}Z_{ab}=IZ_{ab}$$

where the impedance $Z_{ab}$ across series inductor 314 with an inductance $L_{match}$ is given by $$Z_{ab}=\sqrt{R_{ab}^2+X_{ab}^2}=X_{L_{match}}=\omega L_{match}$$

where the inductive reactance $X_L$ of an inductor with inductance L is given by $X_L=\omega L$ where $\omega$ is the angular frequency of the instantaneous potential difference v given by $$v=V_{max}\sin(\omega t)=\sqrt{2}V_{eff}\sin(\omega t)=\sqrt{2}V_{eff}\sin(2\Pi ft)$$

where f is the frequency (in Hertz) and where the instantaneous current i is given by $$i=I_{max}\sin(\omega t-\phi)=\sqrt{2}I_{eff}\sin(\omega t-\phi)=\sqrt{2}I\sin(\omega t-\phi)$$

and the phase angle $\phi_{ab}$ between the instantaneous potential difference $v_{ab}$ and the instantaneous current i across series inductor 314 with an inductance $L_{match}$ is given by $$\phi_{ab}=\tan^{-1}\left(\frac{X_{ab}}{R_{ab}}\right)=\tan^{-1}\left(\frac{\omega L_{match}}{0}\right)=\tan^{-1}(+\infty)=+\frac{\pi}{2}$$

so that the instantaneous potential difference $v_{ab}$ across series inductor 314 leads the instantaneous current i in the series inductor 314 by 90° and the effective potential difference $V_{ab}$ is equal to $I\omega L_{match}$ between points a and b across series inductor 314.

The effective potential difference $V_{bc}$ between points b and c across series resistor 316 with an effective resistance R is given by $$V_{bc}=IZ_{bc}$$

where the impedance $Z_{bc}$ across series resistor 316 with an effective resistance R is given by $$Z_{bc}=\sqrt{R_{bc}^2+X_{bc}^2}=R$$

where the phase angle $\phi_{bc}$ between the instantaneous potential difference $v_{bc}$ and the instantaneous current i across series resistor 316 with an effective resistance R is given by $$\phi_{bc}=\tan^{-1}\left(\frac{X_{bc}}{R_{bc}}\right)=\tan^{-1}\left(\frac{0}{R}\right)=\tan^{-1}(0)=0$$

so that the instantaneous potential difference $v_{bc}$ across series resistor 316 is in phase with the instantaneous current i in the series resistor 316 and the effective potential difference $V_{bc}$ is equal to IR between points b and c across series resistor 316.

The effective potential difference $V_{cd}$ between points c and d across coil 2 with an inductance $L_{coil}$ is given by $$V_{cd}=IZ_{cd}$$

where the impedance $Z_{cd}$ across coil 2 with an inductance $L_{coil}$ is given by $$Z_{cd}=\sqrt{R_{cd}^2+X_{cd}^2}=X_{L_{coil}}=\omega L_{coil}$$

where the phase angle $\phi_{cd}$ between the instantaneous potential difference $v_{cd}$ and the instantaneous current i across coil 2 with an inductance $L_{coil}$ is given by $$\phi_{cd}=\tan^{-1}\left(\frac{X_{cd}}{R_{cd}}\right)=\tan^{-1}\left(\frac{\omega L_{coil}}{0}\right)=\tan^{-1}(+\infty)=+\frac{\pi}{2}$$

so that the instantaneous potential difference $v_{cd}$ across coil 2 leads the instantaneous current i in the series inductor by 90° and the effective potential difference $V_{cd}$ is equal to $I\omega L_{coil}$ between points c and d across coil 2.

The effective potential difference $V_{de}$ between points d and e across blocking variable capacitor 4 with a variable capacitance $C_{block}$ is given by $$V_{de}=IZ_{de}$$

where the impedance $Z_{de}$ across blocking variable capacitor 4 with a variable capacitance $C_{block}$ is given by $$Z_{de}=\sqrt{R_{de}^2+X_{de}^2}=X_{C_{block}}=\frac{1}{\omega C_{block}}$$

where the capacitive reactance $X_C$ of a capacitor with capacitance C is given by $X_C=(\omega C)^{-1}$ and the phase angle $\phi_{de}$ between the instantaneous potential difference $v_{de}$ and the instantaneous current i across blocking variable capacitor 4 with a variable capacitance $C_{block}$ is given by $$\phi_{de}=\tan^{-1}\left(\frac{X_{de}}{R_{de}}\right)=\tan^{-1}\left(\frac{-\frac{1}{\omega C_{block}}}{0}\right)=\tan^{-1}(-\infty)=-\frac{\pi}{2}$$

so that the instantaneous potential difference $v_{de}$ across blocking variable capacitor 4 lags the instantaneous current i in the blocking variable capacitor 308 by 90° and the effective potential difference $V_{de}$ is equal to $I(\omega C_{block})^{-1}$ between points d and e across blocking variable capacitor 4.

For a given angular frequency $\omega$, the blocking variable capacitor 4 may be chosen to have a variable capacitance $C_{block}$ so that the effective potential difference $V_{de}=I(\omega C_{block})^{-1}$ between points d and e across blocking variable capacitor 4 is substantially equal to the effective potential difference $V_{cd}=I\omega L_{coil}$ between points c and d across coil 2. The instantaneous potential difference $v_{de}$ across blocking variable capacitor 4 would then lag the instantaneous potential difference $v_{cd}$ across coil 2 by 180° and the instantaneous potential difference $v_{de}$ across blocking variable capacitor 4 consequently would be completely out of phase with the instantaneous potential difference $v_{cd}$ across coil 2. Ignoring the effect of any bias induced on the coil such as a substantially constant DC offset bias or a DC self-bias, the effective potential V vanishes (V=0) at point c so that a hypothetical voltmeter (not shown) measuring the potential differences between point c and point e would read zero.

For a particular angular frequency ω, the variable capacitance $C_{block}$ of the blocking variable capacitor 4 may be chosen so that the effective potential difference $V_{de}=I(\omega C_{block})^{-1}$ between points d and e across blocking variable capacitor 4 is substantially equal to half the effective potential difference $V_{cd}=I(\omega L_{coil}=2V_{de}=2I(\omega C_{block})^{-1}$ between points c and d across coil 2. The instantaneous potential difference $v_{de}$ across blocking variable capacitor 4 would again lag the instantaneous potential difference $v_{cd}$ across coil 2 by 180° and the instantaneous potential difference $v_{de}$ across blocking variable capacitor 4 consequently would again be completely out of phase with the instantaneous potential difference $v_{cd}$ across coil 2. Again, ignoring for the moment any DC offset bias or a DC self-bias, the effective potential V vanishes (V=0) at a point along the coil 2 substantially halfway between point c and point d so that a hypothetical voltmeter (not shown) placed between the point (substantially halfway between point c and point d) and point e would read zero.

Similarly, the variable capacitance $C_{block}$ of the blocking variable capacitor 4 may be chosen so that the effective potential difference $V_{de}=I(\omega C_{block})^{-1}$ between points d and e across blocking variable capacitor 4 is substantially equal to $n^{-1}$ times the effective potential difference $V_{cd}=I\omega L_{coil}=nV_{de}=nI(\omega C_{block})^{-1}$ between points c and d across coil 2, where n is any positive real number. The instantaneous potential difference $v_{de}$ across blocking variable capacitor 4 would again lag the instantaneous potential difference $v_{cd}$ across coil 2 by 180° and the instantaneous potential difference $v_{de}$ across blocking variable capacitor 4 consequently would again be completely out of phase with the instantaneous potential difference $v_{cd}$ across coil 2. It is believed that the effective potential V vanishes (V=0) at a point along the coil 2 substantially $(n-1)n^{-1}$ of the way between point c and point d so that a voltmeter (not shown) between the point (substantially $(n-1)n^{-1}$ of the way between point c and point d) and point e would read zero. In the limit that n becomes very large, the point where the effective potential V vanishes (V=0) along the coil 2 approaches arbitrarily close to point d.

Alternatively, for a constant angular frequency ω, the variable capacitance $C_{block}$ of the blocking variable capacitor 4 may be chosen so that the effective potential difference $V_{de}=I(\omega C_{block})^{-1}$ between points d and e across blocking variable capacitor 4 is substantially equal to (n−1)n−1times the effective potential difference $V_{cd}=I\omega L_{coil}=(n-1)^{-1}nV_{de}=nI(\omega C_{block})^{-1}$ between points c and d across coil 2, where n is any positive real number. The instantaneous potential difference $v_{de}$ across blocking variable capacitor 4 would again lag the instantaneous potential difference $v_{cd}$ across coil 2 by 180° and the instantaneous potential difference $v_{de}$ across blocking variable capacitor 4 consequently would again be completely out of phase with the instantaneous potential difference $v_{cd}$ across coil 2. Ignoring any DC offset bias or a DC self-bias, the effective potential V vanishes (V=0) at a point along the coil 2 substantially $n^{-1}$ of the way between point c and point d so that a voltmeter (not shown) between the point (substantially $n^{-1}$ of the way between point c and point d) and point e would read zero. In the limit that n becomes very large, the point where the effective potential V vanishes (V=0) along the coil 2 approaches arbitrarily close to point c.

The above examples demonstrate that the variable capacitance $C_{block}$ of the blocking variable capacitor 4 may be chosen so that the effective potential V may be made to vanish (V=0) at any point along the coil 2 between point c and point d. This ability to vary the point along the coil 2 at which the effective potential V vanishes (V=0) may be used to shift the RF voltage distributions along the coil 2, and to shift the ionization of the plasma, so that the point of minimum peak-to-peak voltage (point L) coincides with the lower-most point of a tilted coil (or the point of maximum cross-sectional area) and the point of maximum peak-to-peak voltage (point H) coincides with the upper-most point of a tilted coil (or the point of least cross-sectional area) to compensate for the RF voltage distribution as described above. As a consequence, it is believed that the material sputtered from the target 110 can be more uniformly ionized and deposited on the substrate 24.

When the coil 2 is biased by a substantially constant DC offset bias, or a DC self-bias, $V_{bias}$, the variable capacitance $C_{block}$ of the blocking variable capacitor 4 may be chosen so that the effective potential V may be made to equal the substantially constant DC offset bias or the DC self-bias ($V=V_{bias}$) at any point along the coil 2 between point c and point d.

Figure 6:
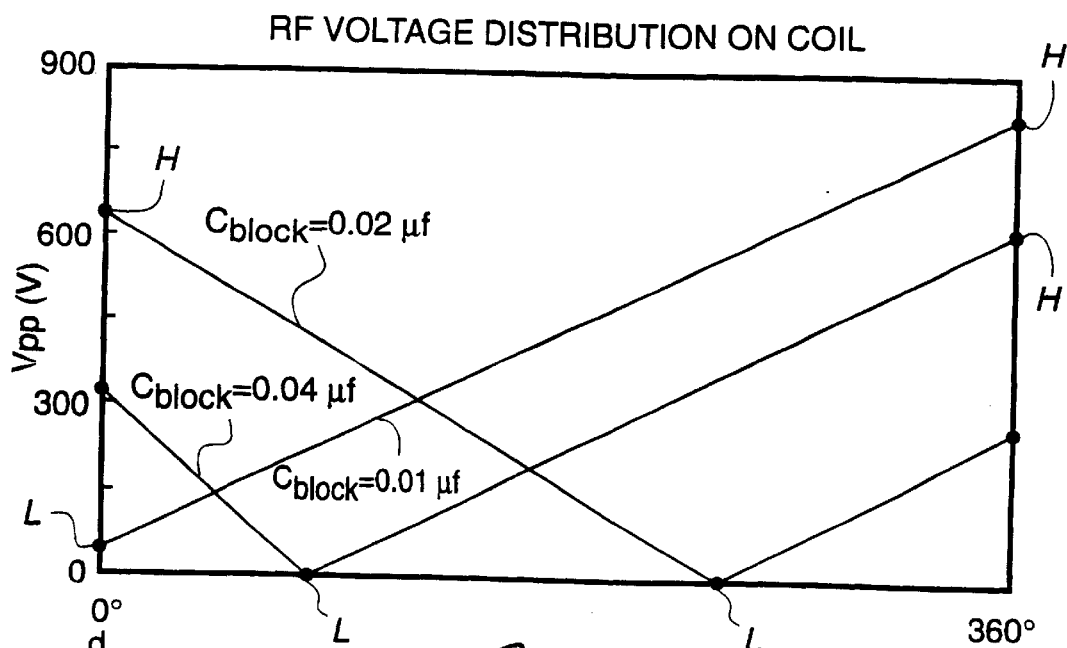
FIG. 6 is a graph depicting shifts in RF voltage distribution along a coil as a function of impedance change.

FIG. 6 is a graph depicting three examples of expected RF voltage distributions along a coil 2 for three different impedances of the blocking capacitor $C_{block}$. In FIG. 6, the distributions of peak to peak RF voltage $V_{pp}$ on the coil 2 are shown as a function of position on the one turn coil 2 represented by coil angle α (FIG. 2) in which coil angle α=0° corresponds to end d (FIG. 5) of the coil and coil angle α=360° corresponds to end b of the coil 2 at which the RF feedthroughs are coupled to the coil.

In one distribution, when the capacitance of the blocking capacitor $C_{block}$ has a value of 0.04 μf, the peak to peak RF voltage $V_{pp}$ at end α=0° may start at 300 volts and is believed to decrease to 0 volts at approximately coil location α=90°. The RF voltage then increases at succeeding locations around the coil until the other end b of the coil (α=360°) is reached where the peak to peak RF voltage has a value of approximately 600 volts. Because the peak to peak voltage is greatest (point H) at the coil location corresponding to coil angle α=360°, a hot spot, i.e., a location of greater sputtering, may develop at that point. However, in accordance with the present invention, the coil 2 may be tilted upward at that point and/or decreased in cross-sectional area to compensate for the RF voltage distribution. Furthermore, the coil may be tilted downward and/or increased in cross-sectional area at point L (α=90°) where the RF peak-to-peak voltage is at a minimum.

In another example, if the capacitance of the blocking capacitor $C_{block}$ is changed to 0.02 μf, for example, the voltage distribution will shift in this example so that the distribution is effectively reversed as shown. More specifically, at this capacitance, the peak to peak RF voltage $V_{pp}$ at end α=0° may start somewhat above 600 volts and is believed to continuously decrease at succeeding locations around the coil until coil location α=240° is reached where $V_{pp}$ is believed to be equal to 0 volts. The RF voltage then increases until the other end b of the coil (α=360°) is reached where the peak to peak RF voltage has a value of approximately 6 volts. Accordingly, the hot spot will shift to the other end of the coil at coil angle α=0°. In this example, the orientation and configuration of the coil would be reversed from that of the prior example to compensate for the RF voltage distribution.

As the voltage distribution is changed, the maximum and minimum values along the coil can change as well. Thus, as shown in FIG. 6, if the capacitance of the blocking capacitor $C_{block}$ is changed to 0.01 μf, for example, the voltage distribution will shift in this example so that the peak to peak RF voltage $V_{pp}$ at end α=0° may start at close to 0 volts and may continuously increase until the other end b of the coil (α=360°) is reached where the peak to peak RF voltage has a value of approximately 800 volts. Accordingly, the maximum and minimum values of the voltage distribution as well as the locations of the maximum and minimum values may be optimized for a particular coil by selecting the appropriate impedance. Other parameters may be changed as well.

It should be noted from FIG. 6, depending upon the circuit component values selected, that the coil location of maximum peak-to-peak RF voltage (point H) and the coil location of minimum peak-to-peak RF voltage (point L) need not be diametrically opposed on the coil perimeter. In which case, the coil may be folded in such a way as to ensure that the coil location of maximum peak-to-peak RF voltage (point H) is located relatively far from the substrate and the coil location of minimum peak-to-peak RF voltage (point L) is located relatively close to the substrate to compensate for the RF voltage distribution.

In those applications where a high degree of impedance matching is desired, the impedance of the input capacitor 310 or the match capacitor 312 may be adjusted so as to maintain a good match as the impedance of the blocking capacitor 4 is selected to define the voltage distributions around the coil 2.

While particular embodiments of the present invention have been shown and described, it will be apparent to those skilled in the art that changes and modifications may be made without departing from this invention in its broader aspects and, therefore, the aim in the appended claims is to cover all such changes and modifications as fall within the true spirit and scope of this invention.

What is claimed is:

1. An apparatus for processing a semiconductor workpiece, comprising:
    a processing chamber for a plasma;
    a workpiece support surface within said chamber and positioned to support said workpiece adjacent said plasma, said workpiece support surface having an axis perpendicular to said workpiece support surface; and
    a coil positioned to inductively couple RF energy into said plasma and to sputter coil material onto said workpiece, wherein said coil defines a central axis which intersects said workpiece support surface axis at an angle.

2. An apparatus for processing a semiconductor workpiece, comprising:
    a processing chamber for a plasma;
    a workpiece support surface within said chamber and positioned to support said workpiece adjacent said plasma, said workpiece support surface having an axis perpendicular to said workpiece support surface; and;
    a coil within said chamber and adapted to inductively couple RF energy into said plasma wherein said coil defines a central axis; and
    a coil support structure positioning said coil central axis at an angle relative to said workpiece support surface axis and thereby compensating for non-uniform thickness deposition induced by non-uniform voltage distributions along said coil.

3. An apparatus for processing a semiconductor workpiece, comprising:
    a processing chamber for a plasma;
    a workpiece support surface within said chamber and positioned to support said workpiece adjacent said plasma; and
    a coil positioned to inductively couple RF energy into said plasma, wherein said coil defines an interior face facing said workpiece central axis, said coil interior face defining a circumference and a coil width, the size of which differs as a function of coil circumference locations in at least 25% of said circumference as compared to the coil interior face widths at coil circumference locations in at least 25% of the remaining coil circumference.

4. In an apparatus for processing a workpiece by delivering ions to the workpiece, which apparatus includes a processing chamber, a workpiece support having a workpiece support surface in the chamber, a sputtering target in the chamber and means for creating an inductively coupled plasma to sputter material from the target, ionize the sputtered material and direct the ionized, sputtered material at the workpiece, the means for creating an inductively coupled plasma including a substantially circular, single turn coil having a central axis and a circumference and an RF power source connected to deliver an RF current to the coil, the RF current establishing in the coil an RF voltage having a peak-to-peak amplitude which varies between a minimum value at a first location along the circumference and a maximum value at a second location along the circumference, the first and second locations being substantially diametrically opposite one another, the RF voltage variation producing a corresponding variation in plasma density around the central axis, the improvement wherein said coil is positioned so that the second location is at a greater distance than the first location from a plane containing the workpiece support surface.

5. The apparatus according to claim 4 wherein said coil lies in a plane which is inclined relative to the plane containing the workpiece support surface.

6. The apparatus according to claim 5 wherein said coil is made of a material which is sputtered by the plasma.

7. The apparatus according to claim 6, wherein said coil has a constant cross section along the circumference.

8. The apparatus according to claim 4, wherein said coil is made of a material which is sputtered by the plasma.

9. The apparatus according to claim 8 wherein said coil has a constant cross section along the circumference.

10. The apparatus according to claim 4 wherein said coil has a constant cross section along the circumference.

11. The apparatus according to claim 10, wherein said coil is made of a material which is sputtered by the plasma.

12. An apparatus for processing a workpiece by delivering ions to the workpiece, which apparatus includes a processing chamber, a workpiece support having a workpiece support surface in the chamber, a sputtering target in the chamber and means for creating an inductively coupled plasma to sputter material from the target, ionize the sputtered material and direct the ionized, sputtered material at the workpiece, the means for creating an inductively coupled plasma including a substantially circular coil having a central axis and a circumference and an RF power source connected to deliver an RF current to the coil, the RF current establishing in the coil an RF voltage having a peak-to-peak amplitude which varies between a minimum value at a first location along the circumference and a maximum value at a second location along the circumference, the first and second locations being substantially diametrically opposite one another, the RF voltage variation producing a corresponding variation in plasma density around the central axis, the improvement wherein said coil is positioned so that the second location is at a greater distance than the first location from a plane containing the workpiece support surface, wherein said coil has a cross section which varies along the circumference from a maximum area at the first location to a minimum area at the second location.

13. The apparatus according to claim 12 wherein the cross section of said coil varies progressively along the circumference.

14. The apparatus according to claim 13 wherein the cross section of said coil is rectangular.

15. The apparatus according to claim 14 wherein said coil is a single turn coil.

16. The apparatus according to claim 15 wherein said coil is made of a material which is sputtered by the plasma.

17. In an apparatus for processing a workpiece by delivering ions to the workpiece, which apparatus includes a processing chamber, a workpiece support having a workpiece support surface in the chamber, a sputtering target in the chamber and means for creating an inductively coupled plasma to sputter material from the target, ionize the sputtered material and direct the ionized, sputtered material at the workpiece, the means for creating an inductively coupled plasma including a substantially circular coil having a central axis and a circumference and an RF power source connected to deliver an RF current to the coil, the RF current establishing in the coil an RF voltage having a peak-to-peak amplitude which varies between a minimum value at a first location along the circumference and a maximum value at a second location along the circumference, the first and second locations being substantially diametrically opposite one another, the RF voltage variation producing a corresponding variation in plasma density around the central axis, the improvement wherein said coil has a cross section which varies along the circumference from a maximum area at the first location to a minimum area at the second location.

18. The apparatus according to claim 17 wherein the cross section of said coil varies progressively along the circumference.

19. The apparatus according to claim 18 wherein the cross section of said coil is rectangular.

20. The apparatus according to claim 19 wherein said coil is a single turn coil.

21. The apparatus according to claim 17 wherein said coil is a single turn coil.

22. The apparatus according to claim 21 wherein said coil is made of a material which is sputtered by the plasma.

23. The apparatus according to claim 17 wherein said coil is made of a material which is sputtered by the plasma.

24. A method of processing a semiconductor workpiece supported by a surface which has an axis perpendicular to said surface, comprising:
inductively coupling RF energy from a coil coupled to a source of RF energy, to a plasma in a processing chamber and sputtering coil material from said coil, wherein said coil defines a central axis which intersects said workpiece support surface axis at an angle; and
ionizing a deposition material in said processing chamber.

25. The method of claim 24 further comprising ionizing a deposition material using said plasma.

26. The method of claim 24 further comprising sputtering said coil to deposit coil material onto said workpiece.

27. The method of claim 24 further comprising etching said workpiece using said plasma.

28. A method of processing a semiconductor workpiece, comprising:
inductively coupling RF energy from a coil coupled to a source of RF energy, to a plasma in a processing chamber, wherein said coil defines an interior face facing said workpiece central axis, said coil interior face defining a circumference and an area, the size of which differs as a function of coil circumference locations in at least 25% of said circumference as compared to the coil interior face widths at coil circumference locations in at least 25% of the remaining coil circumference; and
sputtering material from said coil interior face onto said workpiece.

29. The method of claim 28 wherein said coil has an RF voltage, the peak to peak value of which varies between a minimum at a first location and a maximum at a second location and wherein the area of said coil interior face at said first location is greater than the area of said coil interior face at said second location.

30. An apparatus for processing a semiconductor workpiece, comprising:
a processing chamber for a plasma;
a workpiece support surface within said chamber and positioned to support said workpiece adjacent said plasma, said workpiece support surface having an axis perpendicular to said workpiece support surface; and
a coil adapted to inductively couple RF energy into said plasma wherein said coil defines a central axis; and
coil support means for positioning said coil central axis within said chamber at an angle relative to said workpiece support surface axis and thereby compensating for non-uniform thickness deposition induced by non-uniform voltage distributions along said coil.

31. A method of processing a semiconductor workpiece supported by a surface in a processing chamber comprising:
inductively coupling RF energy from a substantially circular, single turn coil having a central axis and a circumference and an RF power source connected to deliver an RF current to the coil, the RF current establishing in the coil an RF voltage having a peak-to-peak amplitude which varies between a minimum value at a first location along the circumference and a maximum value at a second location along the circumference, the first and second locations being substantially diametrically opposite one another, the RF voltage variation producing a corresponding variation in plasma density around the central axis, wherein said coil is positioned so that the second location is at a greater distance than the first location from a plane containing the workpiece support surface; and
ionizing a deposition material in said processing chamber.

32. The method according to claim 31 wherein said coil lies in a plane which is inclined relative to the plane containing the workpiece support surface.

33. The method according to claim 32 wherein said coil has a constant cross section along the circumference.

34. The method according to claim 32 wherein said coil is made of a material which is sputtered by the plasma.

35. The method according to claim 34 wherein said coil has a constant cross section along the circumference.

36. The method according to claim 31 wherein said coil has a constant cross section along the circumference.

37. A method of processing a semiconductor workpiece supported by a surface in a processing chamber having an axis perpendicular to said surface, comprising:
inductively coupling RF energy from a substantially circular coil having a central axis and a circumference and an RF power source connected to deliver an RF current to the coil, the RF current establishing in the coil an RF voltage having a peak-to-peak amplitude which varies between a minimum value at a first location along the circumference and a maximum value at a second location along the circumference, the first and second locations being substantially diametrically opposite one another, the RF voltage variation producing a corresponding variation in plasma density around the central axis, wherein said coil is positioned so that the second location is at a greater distance than the first location from a plane containing the workpiece support surface; and ionizing a deposition material in said processing chamber;

wherein said coil has a cross section which varies along the circumference from a maximum area at the first location to a minimum area at the second location.

38. The method according to claim 37 wherein the cross section of said coil varies progressively along the circumference.

39. The method according to claim 38 wherein the cross section of said coil is rectangular.

40. The method according to claim 39 wherein said coil is a single turn coil.

41. The method according to claim 40 wherein said coil is made of a material which is sputtered by the plasma.

42. The method according to claim 37 wherein said coil is a single turn coil.

43. The method according to claim 42 wherein said coil is made of a material which is sputtered by the plasma.

44. The method according to claim 42 wherein said coil is made of a material which is sputtered by the plasma.

45. A method of processing a semiconductor workpiece supported by a surface which has an axis perpendicular to said surface, comprising:

inductively coupling RF energy from a substantially circular coil having a central axis and a circumference and an RF power source connected to deliver an RF current to the coil, the RF current establishing in the coil an RF voltage having a peak-to-peak amplitude which varies between a minimum value at a first location along the circumference and a maximum value at a second location along the circumference, the first and second locations being substantially diametrically opposite one another, the RF voltage variation producing a corresponding variation in plasma density around the central axis, wherein said coil has a cross section which varies along the circumference from a maximum area at the first location to a minimum area at the second location; and ionizing a deposition material in said processing chamber.

46. The method according to claim 45 wherein the cross section of said coil varies progressively along the circumference.

47. The method according to claim 46 wherein the cross section of said coil is rectangular.

48. The method according to claim 47 wherein said coil is a single turn coil.

49. The method according to claim 45 wherein said coil is a single turn coil.

50. The method according to claim 49 wherein said coil is made of a material which is sputtered by the plasma.

51. The method according to claim 45 wherein said coil is made of a material which is sputtered by the plasma.

52. A method of constructing an apparatus for processing a semiconductor workpiece, comprising:

providing a processing chamber for a plasma;

positioning a workpiece support surface within said chamber to support said workpiece adjacent said plasma, said workpiece support surface having an axis perpendicular to said workpiece support surface;

providing a coil adapted to inductively couple RF energy into said plasma wherein said coil defines a central axis; and positioning said coil central axis in said chamber at an angle relative to said workpiece support surface axis and thereby compensating for non-uniform thickness deposition induced by non-uniform voltage distributions along said coil.

53. The method according to claim 52 wherein said coil has a constant cross section along the circumference.

\* \* \* \* \*